United States Patent [19]

Buller et al.

[11] Patent Number: 4,978,638

[45] Date of Patent: Dec. 18, 1990

[54] METHOD FOR ATTACHING HEAT SINK TO PLASTIC PACKAGED ELECTRONIC COMPONENT

[75] Inventors: Marvin L. Buller, Austin; Barbara J. McNelis; Campbell H. Snyder, all of Austin, Tex.

[73] Assignee: International Business Machines Corporation, Armonk, N.Y.

[21] Appl. No.: 454,655

[22] Filed: Dec. 21, 1989

[51] Int. Cl.⁵ ............................................. H01L 23/40
[52] U.S. Cl. .................................... 437/209; 437/902; 357/81; 165/80.3; 439/487
[58] Field of Search ............... 437/902, 209, 214, 216, 437/217, 219, 220, 221, 224, 249; 357/70, 81; 264/272.11, 272.17; 361/381, 383, 386, 389; 165/80.3; 439/68, 73, 485, 487

[56] References Cited

U.S. PATENT DOCUMENTS

| | | | |
|---|---|---|---|
| 3,893,161 | 7/1975 | Pedak, Jr. | 357/81 |
| 4,012,769 | 3/1977 | Edwards et al. | 357/81 |
| 4,041,524 | 9/1977 | Trunk et al. | 357/81 |
| 4,107,555 | 8/1978 | Haas et al. | 357/80 |
| 4,203,488 | 5/1980 | Johnson et al. | 357/81 |
| 4,222,090 | 9/1980 | Jaffe | 361/386 |
| 4,235,285 | 11/1980 | Johnson et al. | 357/81 |
| 4,408,220 | 10/1983 | Calabro | 357/81 |
| 4,552,206 | 11/1985 | Johnson et al. | 357/79 |

FOREIGN PATENT DOCUMENTS 0171154  3/1989  Japan .

OTHER PUBLICATIONS

T. J. Demaine et al., "Attachable heat Sink for Pluggable Modules", IBM Technical Disclosure Bulletin, vol. 22, No. 3, 8/79, 00/960–961

S. W. Lee et al., "Low Profile Heat Sink", IBM Technical Disclosure Bulletin, vol. 28, No. 12, May, 1986, pp. 5172–5173.

S. A. Curtis et al., "Surface Mount Chip Packaging", IBM Technical Disclosure Bulletin, vol. 28, No. 12, May, 1986, pp. 5531–5532.

Primary Examiner—Olik Chaudhuri
Assistant Examiner—David E. Graybill
Attorney, Agent, or Firm—Andrea P. Bryant

[57] ABSTRACT

Described is an improvement for thermal enhancement technology for high power dissipating plastic packaged electronic circuit chips derived from providing structural features in the plastic package adapted to snap fit with complementarily formed edges of heat sink members.

7 Claims, 3 Drawing Sheets

METHOD FOR ATTACHING HEAT SINK TO PLASTIC PACKAGED ELECTRONIC COMPONENT

BACKGROUND OF THE INVENTION

1. Field of the Invention

This invention relates to cooling integrated circuit chip packages and more particularly it relates to improved convective cooling of high power devices in molded plastic packages.

2. Prior Art

Various heat sinking configurations for the enhancement of integrated circuit chip packages are known. In many instances, additional spring clamps are used to assist in the assembly of the heat sink to the circuit package. Clamps require additional parts with their associated costs and increased handling and inventory overhead. A spring/clamp attach technique also fails to reduce potential thermal interface problems which may occur when two non-flat surfaces are mated together. This interface mismatch increases the thermal resistance to heat flow and, thus, reduces the amount of power that can be dissipated by the assembled heat sink.

Available techniques to reduce the above noted interface thermal resistance problem include the utilization of a material such as a thermal grease or a thermal epoxy between the circuit package and the thermal enhancement (heat sink).

Results obtained from characterizing bonded heat sink components indicate that a heat sink sufficiently enhances the power handling capability of the circuit package. FIG. 1 shows, for a three-fin heat sink, an empirically developed plot of temperature rise of a plastic packaged circuit chip versus power dissipation of that circuit chip. Temperature rise from the upper surface of a plastic package (case) to the module ambient (air) is plotted on the vertical axis as a function of the power dissipation of the circuit chip on the horizontal axis. Comparison of the two plots indicates increased power handling capability for the same temperature differential when the plastic package is enhanced with a three-fin heat sink. This increase in power dissipation relates directly to an increase in performance, function, and reliability.

FIG. 2 exemplifies conventional surface mount plastic package heat sinks. A leaded component (not visible) is packaged in molded plastic housing 4, also known as a flat pack. Component leads 6 extend from housing 4, which is typically formed by joining two separately molded members 8 and 10 at the interface indicated by dotted line 12.

Interface material 14, typically thermal glue or epoxy, is sized to conform to the upper planar surface 16 of housing 4. An extruded finned heat sink 18 is retained in heat conducting relation to component housing 4 by interface material 14.

One difficulty with such a thermal enhancement technique is the attendant requirement for special tooling to accurately align and orient the heat sink and interface material with respect to the component during epoxy curing operation(s) in order to avoid any misalignment which would have a negative impact on efficient utilization of the thermal enhancement.

Further, epoxy is difficult to handle in a rework environment since it forms a strong bond the breaking of which increases the chances of damage to the assembly.

Some of these problems may be solved with the use of a non-curing thermal grease as the interface material. However, a thermal grease still must be applied to one of the two mating surfaces, and its use induces alignment problems since it does not "set". Although thermal grease is very reworkable, it is not stable. This feature implies that a slip could occur between the two bonded surfaces which would reduce the effectiveness of the enhancement. Thermal grease could leak out if not adequately confined; and its material properties may change with time creating a material interface not representative of initial design requirements.

Prior art heat dissipation methods are adequate so long as circuit package design and spacing constraints are such that an additional spring assembly can be incorporated into the product design. When the assembly procedure is such that a curing cycle does not add unacceptable expense in the form of additional ovens, floor space, utility consumption, material handling, etc., the use of epoxy bond is acceptable. If material stability is not a problem, then thermal grease interface techniques may be used.

There exists, therefore, a need for an efficient, cost effective, reworkable thermal enhancement arrangement for enabling use of high power devices in low end systems.

IBM Technical Disclosure Bulletin, Vol. 22, No. 3, 8/79. p. 960 to DeMaine et al describes a field removable, replaceable, and reusable heat sink. Attachment of the heat sink to the module is accomplished by means of a heat or chemically shrinkable plastic collar. IBM Technical Disclosure Bulletin, Vol. 28, No. 12, 5/86. p. 5172 to Lee et al discloses a heat sink adapted for attachment to a module with a spring clip.

IBM Technical Disclosure Bulletin, Vol. 28, No. 12, 5/86. p. 5531 to Curtis et al discloses a technique for thermally enhancing plastic packaged modules by bonding ceramic to the device lead frame prior to encapsulation.

Presently, it is desirable to use automated assembly procedures with reduced assembly operations. Included in such procedures is an additional desire to stock minimum parts, and to have a reworkable enhancement assembly technique which performs uniformly with respect to the lifetime of the circuit package. In this case prior art circuit package thermal enhancement attachment techniques are inadequate.

Accordingly, it is an object of this invention to provide an improved, simplified attachment technique for the assembly of a reworkable convective heat sink to a circuit package.

It is a further object of the present invention to attach the convective heat sink to a circuit package without introducing new materials and/or processes to the assembly operation.

It is a still further object of this invention to provide an assembly technique that is not restricted to a single convective heat sink design.

It is still another object of this invention to insure that the convective heat sink is correctly oriented with respect to the orientation of the circuit package and the cooling flow.

SUMMARY OF THE INVENTION

The present invention overcomes the difficulties associated with adapting prior art thermal enhancement techniques to plastic circuit packaging by molding features into the plastic cover so as to readily mate with a complementarily configured heat sink. In one embodiment the plastic package and heat sink are configured during molding and/or extrusion forming steps to mate together and includes an interface material between them when assembled. In another embodiment the heat sink and plastic package are configured to snap into mating engagement without a need for interface material therebetween. Either embodiment may be implemented using automated material handling techniques.

The present invention is described below as implemented in a molded plastic package for an integrated circuit chip. Incorporated in the upper section of the plastic package is a portion of an improved attachment mechanism for a heat sink. A convective heat sink is removably mounted to the top of the molded plastic package, through engagement with matingly configured features molded into or attached to the top surface of the package.

Providing heat sink element receiving members on the package allows attachment of a heat sink yielding a thermally enhanced package, optimized for placement, orientation, attachment, and assembly procedures. The present invention additionally facilitates both greater reworkability of and optimized power dissipation from the circuit chip.

BRIEF DESCRIPTION OF THE DRAWINGS

The above and other features and advantages of the present invention will be described having reference to the accompanying drawing, wherein like reference numerals are used throughout to designate the same elements and wherein.

DESCRIPTION OF THE PREFERRED EMBODIMENT

The present invention finds particular utility with high power components such as microprocessors. Currently such devices are available in plastic flatpacks which are generally square.

Figure 1:
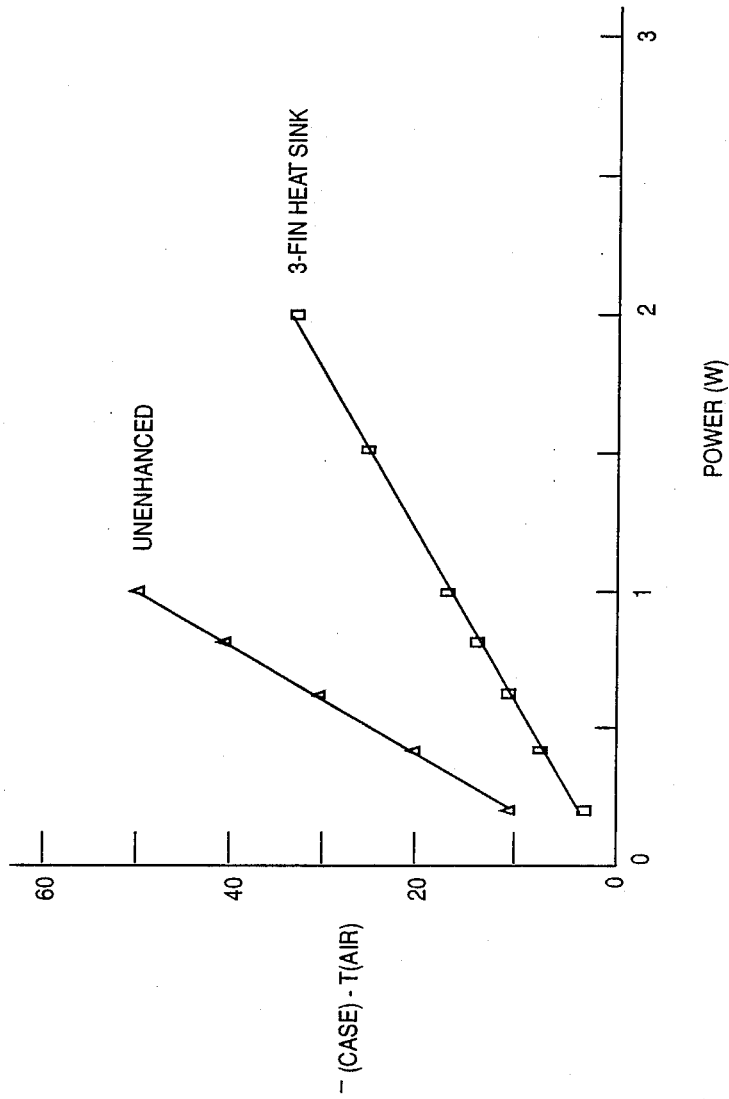
FIG. 1 is a graphic representation of a comparison of thermal characteristics of a plastic chip package with and without thermal enhancement.
Figure 2:
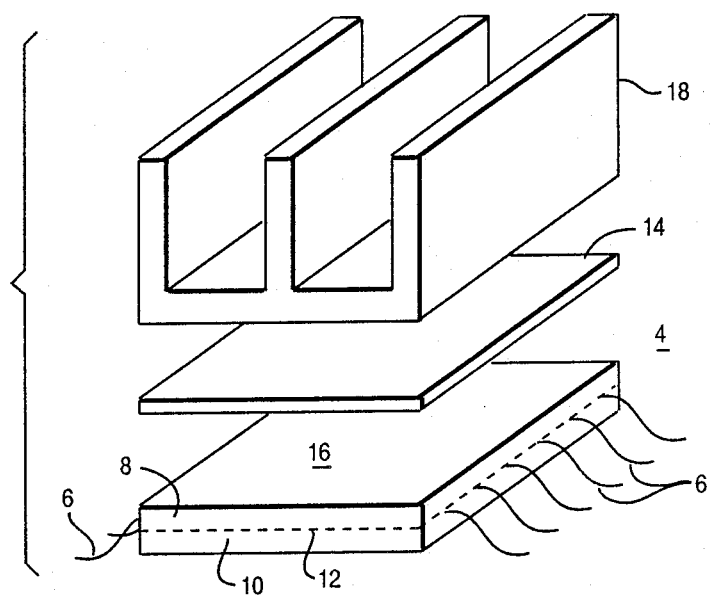
FIG. 2 is an exploded view of a conventional heat sink apparatus for surface mount plastic packages.
Figure 3:
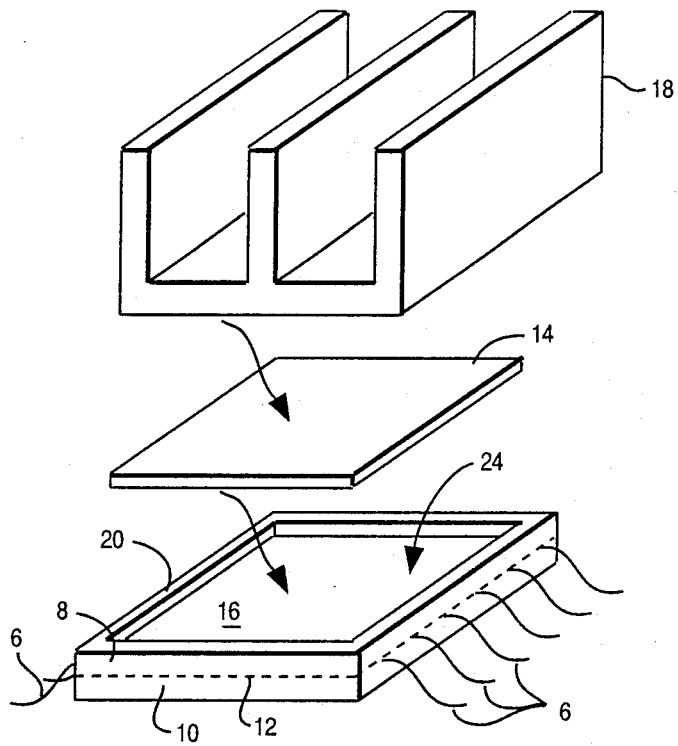
FIG. 3 is an exploded, perspective view of a first embodiment of the invention.

Referring now to FIG. 3, a perspective view of a plastic chip package 4 is shown with surface 16 of its top section 8 modified in accordance with our invention to accept a typical heat sink 18. The modification of surface 16 shown in FIG. 3 results in a raised ridge or flange 20, around the upper perimeter of housing section 8, which forms an indentation or cavity 24 surrounded by flange 20 on top surface 16 of plastic package 4.

In operation, a plastic package 4 provided with the surface configuration shown in FIG. 3 is assembled to a circuit card (not shown) in accordance with conventional electronic card assembly manufacturing processes. Thermally conductive interface material 14, sized to conform to the exposed area of surface 16 within flange 20 is placed therein, followed by heat sink 18.

Cavity 24 serves the purpose of insuring that heat sink 18 is properly oriented and aligned on plastic circuit package 4 and is not subject to being dislodged during subsequent process steps. Such necessary steps include curing interface material 14. Flange 20 further insures that heat sink 18 is placed in the same orientation as plastic package 4, substantially eliminating skewing of the heat sink 18 by handling or vibration.

Figure 4:
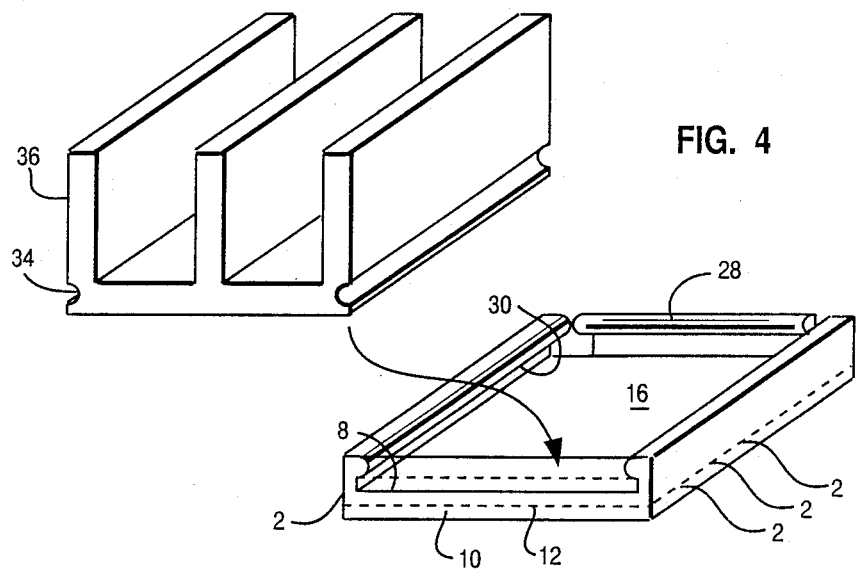
FIG. 4 is an exploded, perspective view of another embodiment of the invention.

Referring now to FIG. 4, an embodiment of the invention is described which enhances assembly and rework capability. An exploded perspective view is shown with top surface 16 of plastic chip package 4 modified by a clip element 28 form around all four edges of top section 10 of package 4. Fingers 30 of clip 28 are molded so as to matingly engage with grooves 34 which have been extruded, molded or machined into the side surfaces of heat sink 36. There is no need for an interface material. Proper alignment of heat sink 36 with respect to the orientation of plastic circuit package 4 is assured. In addition, the reworkability of the package is optimized by the ease in which the heat sink can be removed from the plastic chip package.

The attachment technique shown in FIG. 4 increases the capability of using the same plastic chip package for various air cooled machines. By use of different heat sink designs (e.g., no. of fins, fin spacing, fin heights, etc.) the same component may be optimized for operation in other electronic systems with different cooling flow rates.

Further, heat sink configuration 36, that is with only two sides thereof having grooves to engage clip 28, allows the same heat sink - plastic package combination to be used in situations with different air flow patterns and directions. Even after being rotated 90 degrees, heat sink 36 may still be snap fit into the other pair of opposed, parallel clip 28 legs.

While the present invention has been described having reference to a preferred embodiment and modifications thereto, those having skill in the art will appreciate that practice of our invention is not limited to the heat sink design used only for illustrative purposes. Alterations to the design of the molded change to the top surface of the plastic chip package to accommodate other heat sink designs needed to meet other cooling requirements (e.g., circular fins, pin fins, etc.) and still other changes in form and detail may be made without departing from the spirit and scope of our invention as described in the following claims.

What is claimed is:

1. A method of thermally enhancing a rectangular plastic packaged electronic component comprising the steps of:
   providing a first member of a pair of complementary matingly engageable elements on an upper planar surface of said component and a second member of said pair of engageable elements on bottom edges of a heat sink; and
   joining said component and heat sink.

2. The method of claim 1 including an additional step between said providing and joining steps comprising:
   inserting an appropriately dimensioned layer of heat conductive interface material between said component and said heat sink.

3. The method of claims 1 or 2 wherein said providing steps includes:
   molding integral with said plastic package a lip around its perimeter on its upper planar surface for defining a cavity having dimensions adapted for receiving said second member of said pair of snap engageable members on said heat sink.

4. The method of claims 1 or 2 wherein said providing step includes:

adding on inwardly extending flange around all edges of said upper planar surface of said plastic packaged component; and forming in said heat sink a pair of grooves, one on each of two parallel sides, adapted for snap engagement with said parallel flanges on said plastic packaged component.

5. A method of attaching an extruded metal heat sink element to a square plastic packaged electronic device on its upper planar surface comprising:

adding on inwardly extending flange around all edges of said upper planar surface of said plastic packaged component;

forming in said heat sink a pair of grooves, one on each of two parallel sides, adapted for snap engagement with either set of parallel flanges on said plastic packaged device; and joining said device and said heat sink.

6. The method of claim 5 wherein said adding step is performed as an integral step in molding said plastic package.

7. The methods of claim 5 or 6 including the additional step, preceding said joining step of placing conformingly dimensioned thermally conductive interface material on said device inside said inwardly extending flange.

* * * * *